(12) United States Patent
Kudo et al.

(10) Patent No.: US 6,531,811 B1
(45) Date of Patent: Mar. 11, 2003

(54) LIQUID METAL ION SOURCE AND METHOD FOR PRODUCING THE SAME

(75) Inventors: Naoya Kudo, Shibukawa (JP); Katsuyoshi Tsunoda, Shibukawa (JP); Yoshinori Terui, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/493,213

(22) Filed: Jan. 28, 2000

(30) Foreign Application Priority Data

Feb. 1, 1999 (JP) ............................................. 11-023859

(51) Int. Cl.$^7$ .............................. H01J 27/26; H01J 9/14
(52) U.S. Cl. ......................... 313/362.1; 445/46; 445/59
(58) Field of Search ................................. 313/230, 232, 313/359.1, 361.1; 445/46, 59

(56) References Cited

U.S. PATENT DOCUMENTS 4,426,582 A * 1/1984 Orloff et al. ......... 250/396 ML
4,780,176 A * 10/1988 Sudarshan et al. .......... 156/643
5,399,865 A * 3/1995 Umemura et al. ....... 250/423 F

FOREIGN PATENT DOCUMENTS

JP          11-25874          1/1999

* cited by examiner

Primary Examiner—Kenneth J. Ramsey
(74) Attorney, Agent, or Firm—Oblon, Spivak, McClelland, Maier & Neustadt, P.C.

(57) ABSTRACT

A liquid metal ion source comprises a reservoir storing a metal to be ionized and a needle electrode to which the metal is fed from the reservoir wherein the size of small pits formed in at least a cone surface of the needle electrode is 0.1 μm–1.5 μm and the small pits exist in the cone surface of the needle electrode in a density of $5 \times 10^4$ number/mm$^2$–$5 \times 10^6$ number/mm$^2$ the small pits being formed by chemically etching.

23 Claims, 1 Drawing Sheet

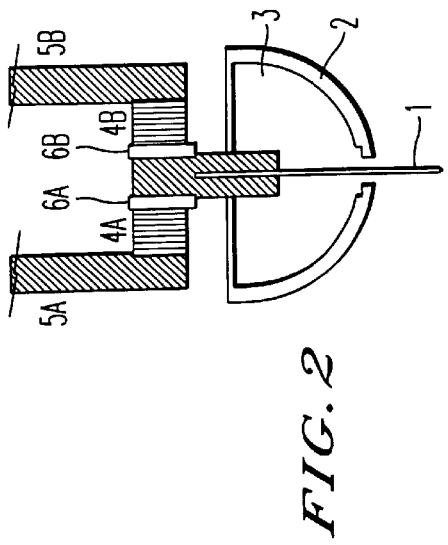
FIG.2
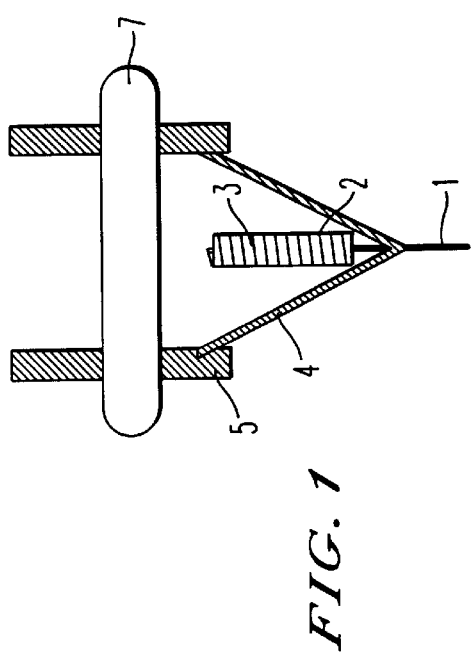
FIG.1
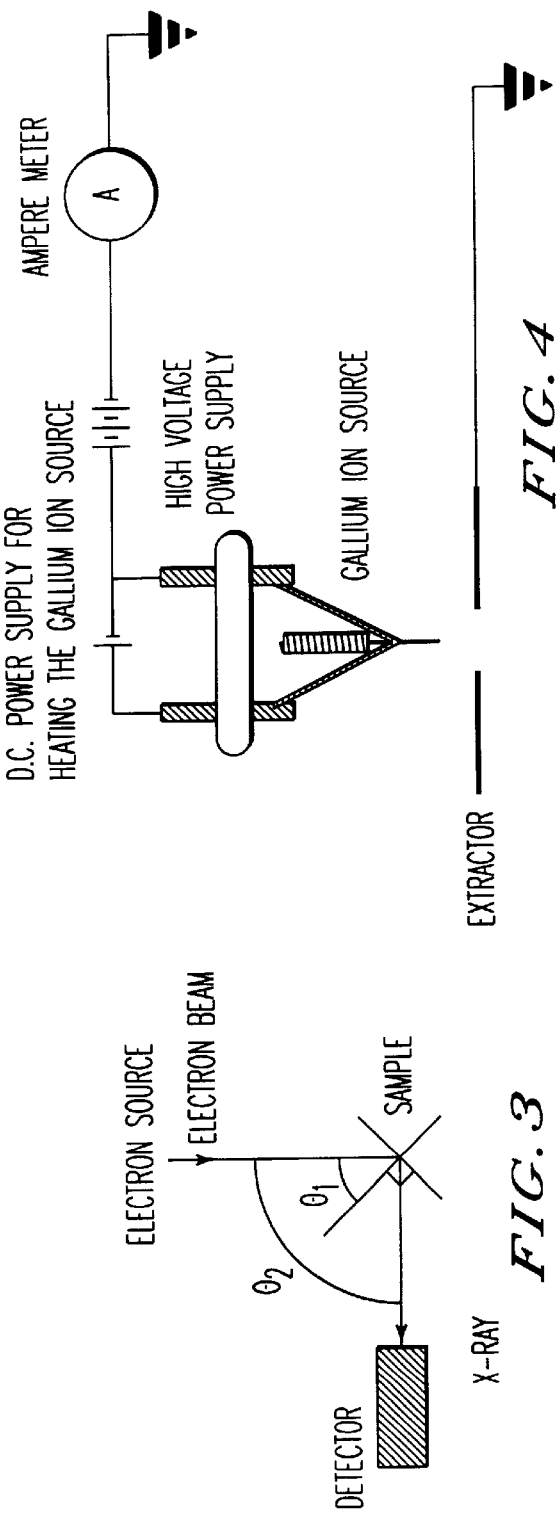
FIG.3
FIG.4

LIQUID METAL ION SOURCE AND METHOD FOR PRODUCING THE SAME

BACKGROUND OF THE INVENTION

1. Field of the Invention

The present invention relates to a liquid metal ion source used for a focused ion beam system such as a mask repair, an ion microscope, a TEM specimen preparation apparatus or an ion beam etching device for analyzing failure in a semiconductor, and a method for producing the same. In particular, it relates to a gallium ion source used suitably for an ion microscope, a focused ion beam system, a TEM specimen preparation apparatus and so on.

A focused ion beam device equipped with a liquid metal ion source used for circuit formation, mask-repairing or surface analyzing in manufacturing a semiconductor integrated circuit has been developed and spread. For the liquid metal ion source, there have been known to use various kinds of metal and alloy as ion species. Among these, a gallium ion source using gallium as ion species has been noted as being preferable for the above-mentioned mask-repairing, surface analysis and TEM specimen preparation.

2. Discussion of Background

As shown in FIG. 1, a liquid metal ion source has such a construction that a needle electrode 1 having a sharp edge at its tip and a reservoir 2 are welded to a hair-pin type heater 4 for heating the needle electrode 1 and the reservoir 2 by Joule heating, and the heater 4 is attached to supporting terminals 5 fixed to an insulating ceramic base 7. The liquid metal ion source is heated by supplying a current to the heater 4 according to requirement. As another construction of the liquid metal ion source, a needle electrode 1 is passed through a reservoir 2 as shown in FIG. 2 wherein the ion source is heated by means of heaters 4A, 4B according to requirement. In either construction, a liquid metal 3 is filled in the reservoir 2. The liquid metal 3 spreads on a surface of the needle electrode 1 and the tip of the needle electrode 1 gets wet with the liquid metal 3 in a molten state.

For the gallium ion source, a tungsten wire having a diameter of about 0.1–0.2 mm is usually used for the needle electrode and a cone portion is formed at the tip of the needle electrode by electropolishing or mechanical processing, and at the same time, the tip of the cone portion is processed to have a radius of coverture of about several $\mu$m.

In such liquid metal ion source, when a positive potential is applied to the needle electrode 1 against an extractor arranged opposing to the liquid metal ion source, the liquid metal at the tip of the needle electrode forms a cone-like projection called Taylor cone when a potential difference becomes equal to a threshold value or larger, and liquid metal ions are emitted from the tip. In this case, the liquid metal ion source using an alloy as ion species is generally used at a high temperature of about 500–600° C., for the purpose of obtaining stable ion emission for a long period of time.

However, it is preferable that the liquid metal ion source, in various ways of usage as described above, is operated at a low temperature from the viewpoint that the energy spread of emitted ions should be small so as to make the beam diameter small.

For the gallium ion source, the operation at room temperature has widely been employed since it is easy to maintain a liquid state at room temperature because of gallium having the melting point of 29.8° C. and keeping easily a super cooling state.

However, when the operation of gallium ion source is continued at room temperature, it becomes impossible to carry out stable ion emission since the surface of gallium is contaminated by residual gases in vacuum and sputtered metals from electrodes, so that the feed of gallium from the reservoir to the tip of needle electrode is disturbed. As a result, there are problems that the ion beam emission becomes unstable and an extractor voltage becomes extremely high in an attempt to keep an amount of the ion beam emission current to a predetermined value.

With respect to the above-mentioned problems, there has been known a technique that the gallium ion source, in which the surface of gallium is once contaminated and the ion beam emission becomes unstable, can recover the original state of ion beam emission, by carrying out an operation called flashing that the temperature of the needle electrode and the reservoir is temporarily raised by means of supplying electrical current into the heater. Accordingly, a stable ion emission time between a flashing operation and the next flashing operation, i.e., a flashing interval is an index of performance of room temperature operation, and an important index on the performance of the gallium ion source.

In order to maintain stable operations, i.e., to improve availability of an ion-beam equipment such as a focused ion beam system or the like, it is necessary to stabilize ion beam emission in the liquid metal ion source for a long time. For such purpose, it is necessary to feed smoothly a liquid metal in an ion source from a reservoir through a side surface of a needle electrode to the tip of the needle electrode. Therefore, the liquid metal ion source having a long flashing interval is desired strongly.

Generally, it has been known for a needle electrode used for a gallium ion source to use a tungsten wire having a diameter of about 0.15 mm and to form a sharp edge at its free end portion by usually an electrolytic process using an aqueous solution of sodium hydroxide as electrolyte, followed by conducting mirror polishing to a side surface of tungsten wire. However, in the conventionally known gallium ion source, there was a problem that the flashing interval was extremely short as several ten hr. In such electrolytic process, there is a technique generally used that the needle electrode is dipped in electrolyte composed of a 1N sodium hydroxide (NaOH) aqueous solution, and a surface of cylindrical portion of a needle electrode, hereinafter referred to as a side surface of the needle electrode, is polished little by little to form a mirror surface while the needle electrode is moved vertically and a d.c. voltage of about 6V is applied to it.

Further, a liquid metal ion source having fine grooves in a side surface of a needle electrode to permit smooth feed of a liquid metal on the side surface of the needle electrode is disclosed in J. Vac Sci. Technol., 16(6), 1871–1874 (1979). In this liquid metal ion source, smooth feed of the liquid metal at the side surface of the needle electrode is obtainable by forming the fine grooves on the side surface of the needle electrode.

However, in such liquid metal ion source, when the operations became unstable, it was revealed that wettability of gallium on a surface of a cone portion of a needle electrode, hereinbelow referred to as a cone surface of a needle electrode, was low. Namely, there was a problem that in considering the feed of the liquid metal from the reservoir through the side surface of the needle electrode to the tip of the needle electrode, a smooth feed of the liquid metal was disturbed on the cone surface of the needle electrode, with the result that a stable ion beam emission time is short and a long flashing interval can not be obtained to a sufficiently practical extent.

The inventors of this application have made extensive studies in consideration of the above-mentioned circumstances, and have achieved the present invention by obtaining the knowledge that when the properties of a side surface of a needle electrode or a cone surface at the free end of the needle electrode are controlled so that gallium covers the needle electrode in a specified state, a flashing interval of the gallium ion source can be prolonged and stable ion beams can be obtained for a long time.

It is an object of the present invention to provide a liquid metal ion source providing a long ion beam emission time, i.e., a long flashing interval, and a stable ion beam emission property, whereby availability of an equipment using the liquid metal ion source can be improved, and productivity of a semiconductor manufacturing apparatus can be improved.

SUMMARY OF THE INVENTION

In accordance with the present invention, there is provided a liquid metal ion source which comprises a reservoir storing a metal to be ionized and a needle electrode to which the metal is fed from the reservoir wherein small pits are formed in a cone surface of the needle electrode.

In the present invention, the size of the small pits is 0.1 $\mu$m–1.5 $\mu$m.

In the present invention, the small pits exist in the cone surface of the needle electrode in a density of $5 \times 10^4$ number/mm$^2$–$5 \times 10^6$ number/mm$^2$.

Further, in accordance with the present invention, there is provided a liquid metal ion source which comprises a reservoir storing gallium as a metal to be ionized and a needle electrode made of tungsten wherein the ratio of the intensities of standardized X-ray of tungsten and gallium detected on a side surface of the needle electrode is 2.0 or lower.

The liquid metal ion source mentioned above may have a heater for Joule heating at least one of the reservoir and the needle electrode made of tungsten.

Further, in accordance with the present invention, there is provided a method for producing a liquid metal ion source wherein gallium is used as a metal to be ionized and at least a side surface of a needle electrode is etched so that the ratio of the intensities of standardized X-ray of tungsten and gallium detected on the side surface of the needle electrode made of tungsten is 2.0 or lower.

In the above-mentioned method, etching is conducted by using an aqueous alkaline solution of potassium ferricyanide.

In the above-mentioned invention, gallium is used as a metal to be ionized; at least a side surface of the needle electrode is etched so that the ratio of the intensities of standardized X-ray of tungsten and gallium detected on the side surface of the needle electrode made of tungsten is 2.0 or lower, and a cone surface of the needle electrode is further etched chemically.

Further, in the above-mentioned invention, in etching the cone surface of the needle electrode, an aqueous solution of oxidative acids is used.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a diagram showing an embodiment of the liquid metal ion source;

FIG. 2 is a diagram of another embodiment of the liquid metal ion source;

FIG. 3 is a diagram showing an arrangement of a sample and devices used for measuring an intensity of X-ray; and FIG. 4 is a diagram of a circuit for measuring an ion beam emission characteristic.

DETAILED DESCRIPTION OF THE PREFERRED EMBODIMENTS

Various studies and experiments have been made by the inventors in considering the above-mentioned circumstances. As a result, the inventors have achieved this invention by finding the fact that in the liquid metal ion source, a liquid metal can smoothly be fed in a stable manner depending on the properties of a side surface of a needle electrode and a cone surface of the needle electrode.

In the present invention, it is essential that small pits are formed in a cone surface of a needle electrode of the liquid metal ion source. In the present invention, the small pits indicate concave shape having a certain depth on a cone surface in the observation by an electron microscope. The depth can be larger than the diameter of the pit. The size of the small pits indicates a dimension obtained by measuring any small pit in the cone surface in a direction perpendicular to the axis of the needle electrode. In the present invention, the small pit in the cone surface of the needle electrode is not limited to have a circular shape.

In the present invention, it is preferable that the size of the small pits in the cone surface of the needle electrode is in a range of 0.1 $\mu$m–1.5 $\mu$m. When the size of the small pits is lower than 0.1 $\mu$m, the object of the present invention may not sufficiently be achieved. On the other hand, when the size exceeds 1.5 $\mu$m, the mechanical strength of the needle electrode decreases and there may cause a change in the shape of the tip of the needle electrode to thereby adversely influence the ion beam emission characteristics of the liquid metal ion source.

Further, it is preferable that the small pits exist in at least the cone surface of the needle electrode in a density of $5 \times 10^4$ number/mm$^2$14 $5 \times 10^6$ number/mm$^2$. When the density of the small pits is lower than $5 \times 10^4$ number/mm$^2$, an expected effect of the present invention may not be obtained. On the other hand, when the density exceeds $5 \times 10^6$ number/mm$^2$, the mechanical strength of the needle electrode decreases and there may cause a change in the shape of the tip of the needle electrode to thereby adversely influence the ion beam emission characteristics of the liquid metal ion source.

Although the reasons as described above are not clear, the inventors estimate that the wettability of the liquid metal to the needle electrode should be at a certain degree or higher in order to assure a long time emission of ion beams from the liquid metal ion source. In particular, the inventors estimate that the wettability of the liquid metal in the cone portion can be improved by providing small pits in at least the cone surface of the needle electrode. In this case, a stable emission of ion beams can be achieved.

Further, the present invention provides a gallium ion source having a reservoir storing gallium to be ionized and a needle electrode having a needle-like tip to which gallium is fed from the reservoir wherein the ratio of the intensities of standardized X-ray of tungsten and gallium detected on a side surface of the needle electrode made of tungsten is 2.0 or lower. Preferably, the present invention provides the above-mentioned gallium ion source which further comprises a heater to heat the reservoir and/or the needle electrode made of tungsten.

As a method for measuring intensities of X-ray in the present invention, a method using energy dispersive spectroscopy will be described. FIG. 3 shows an arrangement of a sample and devices used for the measurement. As conditions for the measurement, an accelerating voltage of incident electrons is 20 kV, an incident angle of electron beam θ1 is 40° and an angle θ2 formed between a detector and an electron source is 90°. A characteristic X-ray for detecting is a Kα line with respect to gallium and a Lα line with respect to tungsten. A measuring region is $2 \times 10^{-3}$ mm² or more.

For the ratio $I_{W/Ga}$ of the intensities of standardized X-ray of tungsten and gallium in the present invention, the intensities of X-ray $I_W$, $I_{Ga}$ of tungsten and gallium detected on the side surface of the needle electrode made of tungsten and the intensities of X-ray $I_{W0}$, $I_{Ga0}$ of tungsten and gallium themselves measured previously under the same conditions, are used, which is expressed in the following formula (1):

$$I_{W/Ga} = (I_W/I_{W0})/(I_{Ga}/I_{Ga0}) \quad (1)$$

The present invention is featurized in that the ratio of the intensities of standardized X-ray of tungsten and gallium detected on the side surface portion of the needle electrode made of tungsten is 2.0 or lower. With the satisfaction of the above-mentioned condition, gallium can stably be fed to the tip of the needle electrode whereby stable emission of ions is obtainable for a long period of time even at room temperature.

Although the reason is not clear, the inventors estimate that an amount of gallium covering the side surface of the needle electrode should be a certain degree or more in order to assure the stable feed of the gallium to the tip of the needle electrode. Namely, even though a surface of gallium is contaminated by residual gases in vacuum or sputtered metals from electrodes, the flow of gallium at the needle electrode can not be disturbed owing to the thick layer of pure gallium for stable flow, so that stable ion emission can be achieved. It is unnecessary to determine a lower limit of the ratio of the intensities of standardized X-ray of tungsten and gallium, for the purpose of achieving the object of the present invention.

With respect to the method for producing the gallium ion source of the present invention, any method can be employed as long as such method can provide an appropriate surface roughness and an appropriate shape in at least the side surface of the needle electrode made of tungsten so that the ratio of the intensities of standardized X-ray of the tungsten and gallium is 2.0 or lower. According to a result of studies by the inventors, the gallium ion source can easily be obtained by etching at least a side surface of a needle electrode followed by processing the tip of the needle electrode to have a predetermined shape by using a known processing method such as a mechanical processing, an electropolishing method or the like.

The above-mentioned etching should preferably be conducted in an aqueous alkali solution of potassium ferricyanide, whereby the gallium ion source of the present invention can stably be produced. Further, the aqueous solution of potassium ferricyanide is alkalized in order to further insure the etching effect. For this, potassium hydroxide and/or sodium hydroxide may be used.

As another method for producing the liquid metal ion source of the present invention, there is such a method that a needle electrode obtained by sharpening its tip by a conventional method and a liquid metal ion source assembly (in a state without storing a liquid metal) mounting the needle electrode thereon are prepared, and small pits are formed in at least a cone surface of the needle electrode by a chemically etching method (which will be described hereinbelow), a physically etching method using plasma, a mechanically processing method or the like. In these methods, the chemically etching method is preferred since an additional step is unnecessary and it provides high productivity. Further, a combination of the method according to the present invention and a method that at least a side surface of a needle electrode is etched and the tip of the needle electrode is processed to have a predetermined shape, is in particular preferable since the liquid metal ion source having a long flashing interval and a long service life can be obtained at a high productivity without an additional step.

An etching solution used for chemically etching can be any as far as small pits can be formed in at least the cone surface of the needle electrode. As examples of such etching solution, there are alkali or acid, such as sodium hydroxide, potassium hydroxide, nitric acid, hydrofluoric acid, hydrochloric acid or the like, a mixed aqueous solution of potassium ferricyanide and potassium hydroxide, a mixed acid of hydrofluoric acid and nitric acid, a mixed acid of nitric acid and hydrochloric acid or the like. Among these, an aqueous solution of oxidative acids, such as a mixed acid of hydrofluoric acid and nitric acid, a mixed acid of nitric acid and hydrochloric acid or the like is preferably used. It is because the needle electrode of a gallium ion source is generally made of tungsten, and small pits can easily be formed.

Now, the present invention will be described in detail with reference to Examples. However, it should be understood that the present invention is by no means restricted by such specific Examples.

EXAMPLE 1

An etching solution was prepared by mixing potassium ferricyanide, pottasium hydroxide and water in a weight ratio of 1:1:20. In the etching solution, a tungsten wire of 0.15 mm in diameter and 20 mm long was dipped to conduct etching for 1 minute at room temperature whereby the tungsten wire having a roughened side surface was prepared.

Then, with use of an aqueous solution of sodium hydroxide as electrolyte, a tip portion of the tungsten wire having a roughened side surface was electropolished to obtain a needle electrode having a sharpened edge for an ion source.

With the needle electrode, a reservoir for gallium, a heater and an insulating ceramic base were assembled to thereby prepare the gallium ion source assembly shown in FIG. 1. The gallium ion source was set in a vacuum system having a crucible in which gallium was previously filled. Under a pressure of $7 \times 10^{-7}$ Torr, the gallium was heated along with the crucible and a current was supplied to the heating section of the gallium ion source assembly. The needle electrode and the reservoir were dipped in the gallium in the crucible while the needle electrode and the reservoir were heated, whereby the reservoir was filled with gallium while a surface of the needle electrode was wet with gallium. Thus, the gallium ion source was obtained.

With respect to the gallium ion source, the intensities of X-ray on a side surface of the needle electrode made of tungsten was measured, under the conditions described below, to obtain the ratio of the intensities of standardized X-ray of tungsten and gallium. Further, flashing interval (600° C.) was measured under the conditions of a total emission current of 2 μA at room temperature. Table 1 shows a result.

<Method for measuring an intensity of X-ray>

An energy dispersive X-ray spectroscopy was used for the measurement. An arrangement of a sample and devices is diagramatically shown (in FIG. 3). As conditions for the measurement, an accelerating voltage of incident electrons was 20 kV, an incident angle of electron beam θ1 was 40° and an angle between a detector and an electron source θ2 was 90°. The intensities of X-ray were measured in a measuring region of about $2.2 \times 10^{-3}$ mm$^2$ with respect to a central portion of the side surface of the needle electrode made of tungsten of the gallium ion source. The X-ray to be detected was the characteristic X-ray of tungsten as a material of the needle electrode and gallium which wetted the surface of the needle electrode wherein $I_W$ and $I_{Ga}$ were measured. In this case, the detected characteristic X-ray was a Kα line with respect to gallium and a Lα line with respect to tungsten.

Further, the intensity of X-ray $I_{Ga0}$ was measured by applying an electron beam to gallium itself which was filled in a container having an appropriate depth, and $I_{W0}$ was measured by changing the sample to a tungsten wire of 0.15 mm in diameter. By using the above-mentioned $I_{Ga0}$, $I_{W0}$, $I_{Ga}$ and $I_W$, the ratio of $I_{W/Ga}$ of the intensities of standardized X-ray of tungsten and gallium was calculated by using the before-mentioned formula (1).

<Measurement of flashing interval (600° C.)>

A measuring system shown in FIG. 4 was used. An extractor made of a perforated metal plate was provided at a position 1.7 mm apart from an apex of the needle electrode. A positive voltage was applied to the gallium ion source to emit ions. In a usual case, a heater current was 0A, i.e., the gallium ion source was operated at room temperature.

In the measurement of flashing interval, a heater current was supplied to heat the needle electrode for several minutes at, for example, about 600° C. to carry out flashing. Then, an extractor voltage Vex was adjusted so that a total emission current became 2 μA in a constant voltage operation. A change with time of the extractor voltage Vex was measured, and a time that a ratio Vex/Vex0 of the extractor voltage Vex to an initial extractor voltage Vex0 reached 1.3 was determined as a flashing interval (600° C.).

TABLE 1

|  | $I_{W/Ga}$ | Flashing interval (600° C.) (Hr) |
|---|---|---|
| Example 1 | 1.48 | 60 |
| Example 2 | 0.75 | 72 |
| Example 3 | 0.57 | 83 |
| Example 4 | 0.44 | 98 |
| Comparative Example | 6.55 | 18 |

EXAMPLES 2–4

A gallium ion source was obtained by conducting the same operations as in Example 1 except that the etching time was changed to 10 minutes, 30 minutes and 60 minutes (which correspond respectively to Example 2, Example 3 and Example 4). Then, evaluation was conducted in the same manner as in Example 1. Table 1 shows results.

COMPARATIVE EXAMPLE

A needle electrode having a sharpened edge for an ion source was prepared by conducting a mirror-surface treatment by electropolishing a side surface of a tungsten wire of 0.15 mm in diameter and 20 mm long by using an aqueous solution of sodium hydroxide as electrolyte, and further electropolishing its tip end portion. The side surface of the prepared needle electrode was in a mirror surface state, which was the same as a conventionally known needle electrode for a gallium ion source. Evaluation was conducted on the gallium ion source in the same manner as in Example 1. Table 1 shows a result.

EXAMPLE 5

A gallium ion source was obtained by the same operations as in Example 4 except that the way of preparing the needle electrode provided with a cone portion having a sharpened edge was changed from the electropolishing method to a mechanically processing method, and the sharpened edge of the tip of the cone portion was formed to be 5 μmR. On the gallium ion source, a flashing interval (750° C.) was measured, by the method as described below, under the conditions of the total emission current of 2 μA at room temperature. Table 2 shows a result.

<Measurement of flashing interval (750° C.)>

A measuring system shown in FIG. 2 was used. An extractor made of a perforated metal plate was provided at a position 1.7 mm apart from the tip of the needle electrode. A positive voltage was applied to the gallium ion source to emit ion beams. During the emission of ion beams, the heater current was 0A, i.e. the gallium ion source was operated at room temperature.

In the measurement of the flashing interval, a predetermined heater current was supplied to heat the needle electrode and the reservoir for several ten sec. so that for example, the reservoir became about 750° C. to carry out flashing. Then, an extractor voltage Vex was adjusted so that a total emission current became 2 μA in a constant voltage operation. A change with time of the extractor voltage Vex was measured, and a time that a ratio Vex/Vex0 to an initial extractor voltage Vex0 reaches 1.3, was determined as a flashing interval (750° C.).

TABLE 2

|  | Size of small pits (μm) | Density of small pits (number/mm$^2$) | Flashing interval (750° C.) (Hr) |
|---|---|---|---|
| Example 5 | — | — | 26 |
| Example 6 | 0.1–0.7 | $7.3 \times 10^5$ | 115 |
| Example 7 | 0.1–1.3 | $1.3 \times 10^6$ | 102 |
| Example 8 | 0.1–1.5 | $4.5 \times 10^5$ | 79 |
| Example 9 | 0.1–0.3 | $9.8 \times 10^4$ | 59 |
| Example 10 | 0.1–0.3 | $2.1 \times 10^5$ | 64 |

EXAMPLE 6

A needle electrode having small apertures in a front surface of a cone portion for a gallium ion source was prepared in the same operations as in Example 5 except that an aqueous solution prepared by mixing concentrated nitric acid and concentrated hydroxide acid in a volume ratio of 1:3, and etching was conducted for 60 minutes at room temperature by dipping the needle electrode.

Then, with the needle electrode for the gallium ion source, a reservoir storing gallium, a heater, an insulating ceramic base and so on were assembled to prepare the gallium ion source assembly as shown in FIG. 1.

With use of a photograph of the gallium ion source assembly taken by a scanning electron microscope of 5,000 magnifications, the size and the density of small pits in the cone surface of the needle electrode were measured. As a result of the observation of a region of 100 $\mu m^2$ in the cone surface of the needle electrode, the size of the small pits is 0.1 $\mu$m–1.5 $\mu$m. The density of the small pits was calculated from the measured number. Table 2 shows the result.

The gallium ion source assembly was placed in a vacuum system having a crucible in which gallium was previously filled. Under a pressure of to 7×10⁻⁷ Torr, the gallium was heated along with the crucible and a current was supplied to the heater of the gallium ion source assembly. The needle electrode and the reservoir were heated and dipped in gallium in the crucible, whereby the surface of the needle electrode was wet with gallium and the reservoir was filled with gallium to thereby obtain the gallium ion source.

On the gallium ion source, the flashing interval (750° C.) was evaluated in the same method as in Example 5. Table 2 shows a result.

EXAMPLES 7 and 8

A galium ion source was obtained by the same operations as Example 6 except that the etching time was changed to 90 minutes and 180 minutes (which respectively correspond to Example 7 and Example 8) by an aqueous solution prepared by mixing concentrated nitric acid and concentrated hydrochloric acid in a volume ratio of 1:3, as an etching liquid. Evaluation was conducted in the same manner as Example 6. Table 2 shows a result.

EXAMPLE 9

A gallium ion source was obtained by the same operations as Example 6 except that the way of preparing the needle electrode with a cone portion having a sharpened edge was changed from the mechanically processing method to a method for electropolishing with use of an aqueous solution of sodium hydroxide as electrolyte. Evaluation was conducted in the same manner as Example 6. Table 2 shows a result.

EXAMPLE 10

A gallium ion source was obtained by the same operations as Example 9 except that the etching time was changed to 90 minutes with use of an aqueous solution prepared by mixing concentrated nitric acid and concentrated hydrochloric acid as etching liquid. Evaluation was conducted in the same manner as Example 6. Table 2 shows a result.

The liquid metal ion source of the present invention is very useful for not only a focused ion beam system but also various kinds of ion-beam equipments because the operating time at room temperature is long; the flashing interval is remarkably improved, and ion beams having high quality and a small energy spread can stably be provided for a long period of time.

According to the method for producing the liquid metal ion source of the present invention, the liquid metal ion source in which the flashing interval is remarkably improved and ion beams are stably provided for a long period of time, can easily be formed without changing largely the conventional steps, and therefore, the method is very effective in industrial use.

Obviously, numerous modifications and variations of the present invention are possible in light of the above teachings. It is therefore to be understood that within the scope of the appended claims, the invention may be practiced otherwise than as specifically described herein.

What is claimed is:

1. A liquid metal ion source which comprises a reservoir storing a metal to be ionized and a needle electrode to which the metal is fed from the reservoir wherein small pits are formed in a cone surface of the needle electrode,
   wherein the needle electrode is formed by a process comprising:
   etching a metal wire to form a rough side surface on the metal wire,
   subsequently electropolishing or mechanically polishing the metal wire to form a tip, and
   wetting the metal wire with an ionizable metal.

2. The liquid metal ion source according to claim 1, wherein the size of the small pits is 0.1 $\mu$m–1.5 $\mu$m.

3. The liquid metal ion source according to claim 2, wherein the small pits exist in the cone surface of the needle electrode in a density of 5×10⁴ number/mm²–5×10⁶ number/mm².

4. The liquid metal ion source of claim 3, wherein the size of the small pits is 0.1–1.5 $\mu$m.

5. The liquid metal ion source of claim 1, wherein said etching comprises an aqueous alkali solution.

6. The liquid metal ion source of claim 1, wherein the metal wire is tungsten.

7. The liquid metal ion source of claim 1, wherein the ionizable metal is gallium.

8. The liquid metal ion source of claim 1, wherein the size of the small pits is 0.1–0.7 $\mu$m.

9. The liquid metal ion source of claim 1, wherein the density of the small pits is 5×10⁴ number/mm² to 7.3×10⁵ number/mm².

10. A liquid metal ion source which comprises a reservoir storing gallium as a metal to be ionized and a needle electrode made of tungsten wherein the ratio of the intensities of standardized X-ray of tungsten and gallium detected on a side surface of the needle electrode is 2.0 or lower,
    wherein the needle electrode is formed by a process comprising:
    etching a tungsten wire to form a rough side surface on the tungsten wire,
    subsequently electropolishing or mechanically polishing the tungsten wire to form a tip, and
    wetting the tungsten wire with gallium.

11. The liquid metal ion source according to claim 10, which further comprises a heater for heating at least one of the reservoir and the needle electrode made of tungsten.

12. The liquid metal ion source of claim 10, wherein the ratio is 1.48 or lower.

13. The liquid metal ion source of claim 10, wherein the ratio is 0.75 or lower.

14. The liquid metal ion source of claim 10, wherein the ratio is 0.44 or lower.

15. A method for producing a liquid metal ion source comprising:
    etching a tungsten wire to form a rough side surface on the tungsten wire,
    subsequently electropolishing or mechanically polishing the tungsten wire to form a tip, and
    wetting the tungsten wire with gallium,
    wherein gallium is used as a metal to be ionized and at least a side surface of a needle electrode is etched so that the ratio of the intensities of standardized X-ray of tungsten and gallium detected on the side surface of the needle electrode made of tungsten is 2.0 or lower.

16. The method of claim 15, wherein the ratio is 1.48 or lower.

17. The method of claim 15, wherein the ratio is 0.75 or lower.

18. The method of claim 15, wherein the ratio is 0.44 or lower.

19. The method of claim 15, wherein the ratio is 1.48 or lower.

20. The method of claim 15, wherein the ratio is 0.44 or lower.

21. The method for producing a liquid metal ion source according to claim 15, wherein etching is conducted by using an aqueous alkaline solution of potassium ferricyanide.

22. The method for producing a liquid metal ion source according to claim 15, wherein gallium is used as a metal to be ionized; at least a side surface of the needle electrode is etched so that the ratio of the intensities of standardized X-ray of tungsten and gallium detected on the side surface of the needle electrode made of tungsten is 2.0 or lower, and a cone surface of the needle electrode is further etched chemically.

23. The method for producing a liquid metal ion source according to claim 22, wherein in etching the cone surface of the needle electrode, an aqueous solution of oxidative acids is used.

* * * * *